United States Patent [19]

Hartgring

[11] Patent Number: 4,910,714
[45] Date of Patent: Mar. 20, 1990

[54] SEMICONDUCTOR MEMORY CIRCUIT HAVING A FAST READ AMPLIFIER TRISTATE BUS DRIVER

[75] Inventor: Cornelis D. Hartgring, Eindhoven, Netherlands

[73] Assignee: U.S. Philips Corp., New York, N.Y.

[21] Appl. No.: 315,184

[22] Filed: Feb. 24, 1989

Related U.S. Application Data

[63] Continuation of Ser. No. 94,225, Sep. 8, 1987, abandoned.

[30] Foreign Application Priority Data

Sep. 11, 1986 [NL] Netherlands ................ 8602295

[51] Int. Cl.⁴ .................................. G11C 7/06
[52] U.S. Cl. ........................ 365/208; 365/189.11; 307/473; 307/530
[58] Field of Search .......... 365/205, 207, 208, 189.11; 307/473, 475, 530

[56] References Cited

U.S. PATENT DOCUMENTS 4,270,190  5/1981  Jindra et al. ..................... 365/205
4,280,065  7/1981  Minato et al. .................... 307/473
4,504,748  3/1985  Oritani .......................... 365/205

*Primary Examiner*—James W. Moffitt
*Attorney, Agent, or Firm*—Steven R. Biren

[57] ABSTRACT

A C-MOS semiconductor memory circuit includes a read amplifier and a tristate bus driver. The read amplifier is a two stage amplifier. The bit lines in the memory are connected via P-MOS pull-up transistors to the supply voltage. The logic low level is 1 Volt below the supply voltage. In order to bring the input signals for the difference amplifier at a most sensitive and fast level, a d.c.-shifting amplifier of the "emitter follower" type is connected between each input thereof and the associated bit line. The difference amplifier and the two follower amplifiers are activated only for a short period of time by means of a selection signal which gives a strong restriction in the power dissipation. The tristate driver comprises a push-pull output stage and an inverting AND gate which is controlled by the output of a difference amplifier and by an equalization signal which is also applied to the difference amplifier and therefore is of a simple design and gives only a low signal delay.

6 Claims, 1 Drawing Sheet

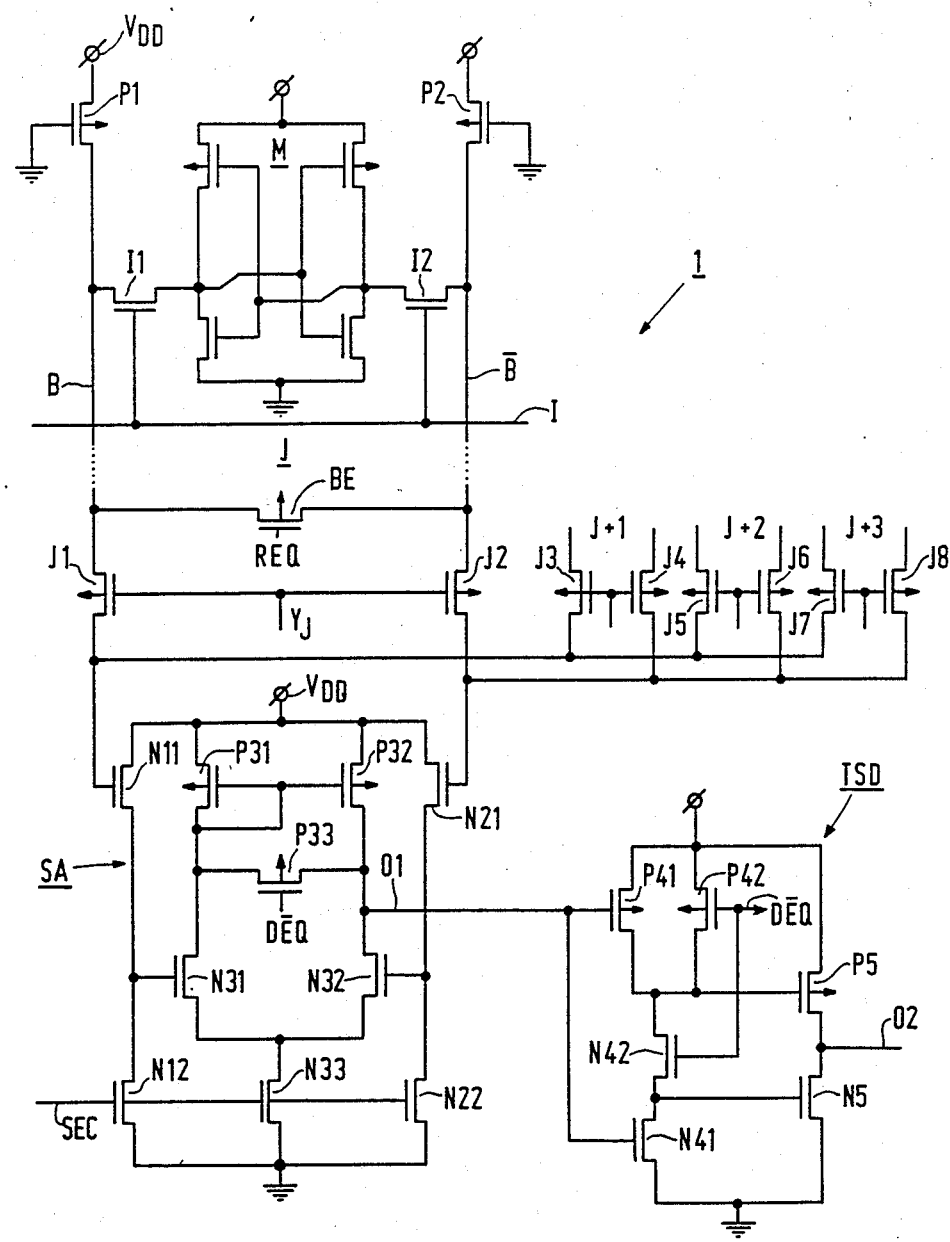

SEMICONDUCTOR MEMORY CIRCUIT HAVING A FAST READ AMPLIFIER TRISTATE BUS DRIVER

This is a continuation of application Ser. No. 094,225, filed Sept. 8, 1987 now abandoned.

BACKGROUND OF THE INVENTION

The invention relates to a semiconductor memory circuit having memory cells which are arranged in columns and rows and which can be connected to a read amplifier by means of selection means, an output of the said amplifier driving a tristate bus driver, two bit lines, to which a column of memory cells is connected, being connected to a supply line via P-MOS pull-up transistors and being fed to an input and to an inverting input of a difference amplifier.

Such a semiconductor memory circuit is known from ISSCC 1984, Feb. 23, pp. 214-215 and 340, in which it was stated that delay times occurring in word and bit lines and also in read amplifiers and bus drivers are of vital importance for memory circuits of large capacity (for example, 256 k bit). A small dissipated power in a memory of comparatively large capacity is also of importance.

SUMMARY OF THE INVENTION

It is the object of the invention to provide a semiconductor memory having a read amplifier and a tristate bus driver in which the combination of the read amplifier and tristate bus driver is improved and simplified, as a result of which a faster availability of the information stored in the memory is realized, and in which nevertheless a reduction of the dissipated power has been achieved.

A semiconductor memory circuit according to the invention is characterized in that each bit line is fed, via a d.c. level-shifting amplifier, to the associated input of the difference amplifier.

Since the bit lines operate very near to the supply voltage level due to the P MOS transistors, a maximum of stability and noise insensitivity is achieved. As a result of this, a logic "low" level is also set at 1 Volt below the supply voltage, as a result of which a rapid equalization of the two logic levels to a pair of bit lines for reading information from a subsequent memory cell is realized. The above can simply be realized by using a d.c. level-shifting amplifier. The read amplifier receives the two complementary logic signals of a pair of bit lines via a follower amplifier. Both the difference amplifier and the follower amplifiers of the read amplifier are activated for only a short read time via a selection signal controlled transistor. As a result of this the power dissipation is very strongly reduced, even if, due to velocity requirements, comparatively much dissipation in the three amplifiers is permitted. Furthermore, the use of the follower amplifiers brings the signals for the inputs of the difference amplifier in an input level which is most sensitive and most rapid for said amplifier. It is to be understood that the follower amplifiers mentioned herein may be of the emitter follower type or, as in the disclosed embodiment, of the source follower type.

An embodiment of a C-MOS semiconductor memory circuit having memory cells which are arranged in columns and rows and which can be connected to a read amplifier by means of selection means, an output of which drives a tristate data bus driver which comprises a C-MOS push-pull output stage, is characterized in that the gate electrode of the P-MOS transistor of the output stage is connected to an output of a C-MOS inverting AND gate, an input of which is connected to the output of the read amplifier and a further input of which receives a control signal which brings the two transistors of the push-pull output stage into a turned-off condition, the gate electrode of the N-MOS transistor of the push-pull output amplifier being connected to a junction of a drain and a source of the two N-MOS transistors of the inverting AND gate. The use of such a tristate bus driver is compact and the bus driver is active only if the control signal is absent, which need be only for a very short duration (for example, during the active state of the read amplifier or only at the end of the active period thereof).

BRIEF DESCRIPTION OF THE DRAWING

The invention will be described in greater detail with reference to an embodiment shown in the single figure of the drawing.

DESCRIPTION OF THE PREFERRED EMBODIMENT

The drawing shows a simplification of a memory circuit 1 according to the invention. The memory circuit 1 comprises memory cells which are arranged in columns and rows and of which only one cell M in a column J is shown in the drawing. The memory cell M is a C-MOS cell which is known per se and which is connected to the two bit lines B and $\bar{B}$ via two pass transistors I1 and I2. The two pass transistors I1 and I2 are controlled via the word line I for accessing the cell M for a read or write action. The two bit lines B and $\bar{B}$ are each connected, via pull up transistors P1 and P2, respectively, to a supply point VDD. An equalizing transistor BE is connected between the bit lines B and $\bar{B}$ and is made conductive for a moment by means of an equalizing signal REQ before a memory cell M in said column is connected to the bit lines B and $\bar{B}$. Via two pass transistors J1 and J2, which are controlled by means of a column selection signal YJ, the two bit lines B and $\bar{B}$ are connected to the read amplifier SA. Via the transistors J3, J4 or J5, J6 or J7, J8, the two bit lines of the columns J+1 or J+2 or J+3 can be connected to the read amplifier SA.

The read amplifier SA comprises three amplifiers; a first and a second follower amplifier and a difference amplifier. The first and the second follower amplifiers, respectively, comprise the transistors N11, N12 and N21, N22, respectively. The difference amplifier comprises three P-MOS transistors P31, P32 and P33 and three N-MOS transistors N31, N32 and N33. By using the pull-up transistors P1 and P2 the logic "high" voltage approaches approximately the supply voltage VDD, while the logic low level is set approximately 1 Volt below VDD. In order to bring voltage levels of the logic high and logic low signals on the bit lines B and $\bar{B}$ at the level which is most sensitive for the difference amplifier having the input transistors N31 and N32 with input and inverting input terminals at their gates, the two follower amplifiers are used having the transistors N11, N12 and N21, N22. The three amplifiers are activated with a selection signal SEC which is supplied to three transistors N12, N22 and N32. The selection signal SEC activates the three amplifiers only for a comparatively short period of time. It is hence permitted, due to gain in velocity, to permit a comparatively high dissipation in the amplifiers. As long as the selection signal SEC is not active, an equalization signal $\overline{DEQ}$ which is applied to the transistor P33 can keep said transistor turned on for equalizing the voltage levels in the two amplifier branches having the transistors P31, N31 and P32, N32.

An output 01 of the read amplifier SA is applied to an input of a C-MOS inverting AND gate of a tristate bus driver TSD. The inverting AND gate comprises the P-MOS transistors P41, P42 and the N-MOS transistors N41, N42 and further receives the equalization signal $\overline{DEQ}$. The output of the inverting AND gate is connected to the gate electrode of P-MOS transistors P5 of the push pull output stage of the tristate bus driver TSD. The N-MOS transistor N5 of the output stage is connected to the junction between the N-MOS transistors N41 and N42. It will be recognized that as long as the equalization signal $\overline{DEQ}$ is low, the transistor P42 is turned on and will turn off the transistors P5 and N42. The N-MOS transistor N41 will be blocked via output 01 of the read amplifier SA in which the equalization signal $\overline{DEQ}$ turns on the transistor P33 and in which the transistors N12, N22 and N33 will be turned off again. The output of the tristate bus driver TSD is now floating (has a high output impedance).

What is claimed is:

1. A C-MOS semiconductor memory circuit having a read amplifier and memory cells which are arranged in columns and rows and which can be connected to said read amplifier by selection means, said read amplifier comprising first and second follower amplifiers and a difference amplifier, an output of said read amplifier driving a tristate bus driver, two bit lines, to which a column of memory cells is connected, being connected to a supply line by P-MOS pull-up transistors, said two bit lines being fed to an input and to an inverting input of said difference amplifier, characterized in that each bit line is fed, by said follower amplifier, to the input and the inverting input of the difference amplifier.

2. A C-MOS semiconductor memory circuit as claimed in claim 1, characterized in that the follower amplifier comprises two series-arranged N-MOS transistors and that the amplifier is of the source follower type.

3. A C-MOS semiconductor memory circuit as claimed in claim 2, characterized in that the difference amplifier and the source follower amplifiers are activated by a common selection signal.

4. A C-MOS semiconductor memory circuit as claimed in claim 3, characterized in that a transistor of each follower amplifier is connected between ground and an input of the difference amplifier and that a bit line is connected to the gate electrode of a further transistor, which is connected between an input of the difference amplifier and a supply node for the difference amplifier.

5. A C-MOS semiconductor memory circuit having memory cells which are arranged in columns and rows and which can be connected to a read amplifier by selection means, an output of said amplifier driving a tristate bus driver which comprises a C-MOS push-pull output stage having a P-MOS transistor and and N-MOS transistor, and a C-MOS inverting AND gate having two N-MOS transistors, characterized in that the gate electrode of the P-MOS transistor of the output stage is connected to an output of said C-MOS inverting AND gate, an input of which is connected to the output of the read amplifier and a further input of which receives a control signal which brings the two transistors of the push-pull output stage into a turned-off condition, the gate electrode of the N-MOS transistor of the push-pull output stage being connected to a junction of a drain and a source of the two N-MOS transistors of the inverting AND gate.

6. A C-MOS semiconductor memory circuit as claimed in claim 5, characterized in that an equalizing transistor is provided in the read amplifier and receives the same control signal as the inverting AND gate.

* * * * *